US009865633B2

(12) United States Patent
Mabuchi et al.

(10) Patent No.: US 9,865,633 B2
(45) Date of Patent: Jan. 9, 2018

(54) SOLID-STATE IMAGING DEVICE AND DRIVING METHOD THEREFOR

(71) Applicant: Sony Corporation, Tokyo (JP)

(72) Inventors: Keiji Mabuchi, Kanagawa (JP); Toshifumi Wakano, Kanagawa (JP); Ken Koseki, Kanagawa (JP)

(73) Assignee: Sony Corporation, Tokyo (JP)

( * ) Notice: Subject to any disclaimer, the term of this patent is extended or adjusted under 35 U.S.C. 154(b) by 150 days.

(21) Appl. No.: 14/619,587

(22) Filed: Feb. 11, 2015

(65) Prior Publication Data

US 2015/0155317 A1 Jun. 4, 2015

Related U.S. Application Data

(60) Continuation of application No. 14/087,295, filed on Nov. 22, 2013, now Pat. No. 9,029,925, which is a (Continued)

(30) Foreign Application Priority Data

Apr. 26, 2004 (JP) .................................. 2004-129388

(51) Int. Cl.
*H04N 5/378* (2011.01)
*H01L 27/146* (2006.01)
(Continued)

(52) U.S. Cl.
CPC .. *H01L 27/14612* (2013.01); *H01L 27/14643* (2013.01); *H04N 5/357* (2013.01);
(Continued)

(58) Field of Classification Search
CPC ........ H01L 27/14612; H01L 27/14643; H04N 5/357; H04N 5/3658; H04N 5/37455; H04N 5/37457; H04N 5/378
(Continued)

(56) References Cited

U.S. PATENT DOCUMENTS 5,237,326 A * 8/1993 Jeong .................... H03M 1/361
341/159
5,721,425 A * 2/1998 Merrill .............. H01L 27/14643
250/214.1
(Continued)

FOREIGN PATENT DOCUMENTS

EP 0757476 A2 2/1997
JP 11026740 1/1991
(Continued)

OTHER PUBLICATIONS

Austin T et al.; Leakage Current: Moore's Law Meets Static Power; Computer, IEEE Service Center; vol. 36, No. 12; Dec. 2003.
(Continued)

*Primary Examiner* — Georgia Y Epps
*Assistant Examiner* — Don Williams
(74) *Attorney, Agent, or Firm* — Michael Best & Friedrich LLP

(57) ABSTRACT

A solid-state imaging device in which the potential of a signal line, which is obtained before a pixel has an operating period, is fixed to an intermediate potential between a first power-supply potential and a second power-supply potential.

20 Claims, 7 Drawing Sheets

Related U.S. Application Data continuation of application No. 13/166,891, filed on Jun. 23, 2011, now Pat. No. 8,618,589, which is a continuation of application No. 12/694,336, filed on Jan. 27, 2010, now Pat. No. 8,008,697, which is a division of application No. 11/113,633, filed on Apr. 25, 2005, now Pat. No. 7,675,095.

(51) Int. Cl.
   H04N 5/365     (2011.01)
   H04N 5/357     (2011.01)
   H04N 5/3745    (2011.01)
   H04N 5/374     (2011.01)

(52) U.S. Cl.
   CPC ......... *H04N 5/3658* (2013.01); *H04N 5/378* (2013.01); *H04N 5/3741* (2013.01); *H04N 5/3742* (2013.01); *H04N 5/3745* (2013.01); *H04N 5/37455* (2013.01); *H04N 5/37457* (2013.01)

(58) Field of Classification Search
   USPC .... 250/208.1, 214 R, 214.1, 214 A, 214 LA, 250/214 SW, 214 C; 348/294–312
   See application file for complete search history.

(56) References Cited

U.S. PATENT DOCUMENTS

| | | |
|---|---|---|
| 5,892,540 A | 4/1999 | Kozlowski et al. |
| 5,965,871 A | 10/1999 | Zhou et al. |
| 6,350,663 B1 | 2/2002 | Kopley et al. |
| 6,784,931 B1 | 8/2004 | Kudo |
| 6,801,256 B1 | 10/2004 | Egawa et al. |
| 7,214,575 B2 | 5/2007 | Rhodes |
| 2002/0051229 A1 | 5/2002 | Eguchi et al. |
| 2003/0179159 A1 | 9/2003 | Ohsawa et al. |
| 2004/0080637 A1* | 4/2004 | Nakamura ............ H04N 5/243 348/255 |
| 2004/0173864 A1 | 9/2004 | Inagaki et al. |
| 2005/0167571 A1* | 8/2005 | Altice, Jr. ............... G01J 1/44 250/208.1 |

FOREIGN PATENT DOCUMENTS

| | | |
|---|---|---|
| JP | 2000004399 A | 1/2000 |
| JP | 2001103377 A | 4/2001 |
| JP | 2001320630 A | 11/2001 |
| JP | 2003-230055 | 8/2003 |
| JP | 2003258231 A | 9/2003 |
| WO | WO-9856170 A1 | 12/1998 |

OTHER PUBLICATIONS

Mabuch k et al.; 6.3—CMOS Image Sensor Using a Floating Diffusion Driving Buried Photodiode; Solid State Circuits Conference, 2004; IEEE International; San Francisco, CA USA.

Extended European Search Report dated Sep. 6, 2016 for corresponding European Application No. 10010103.9.

* cited by examiner

SOLID-STATE IMAGING DEVICE AND DRIVING METHOD THEREFOR

RELATED APPLICATION DATA

This application is a Continuation of U.S. patent application Ser. No. 14/087,295, filed Nov. 22, 2013, which is a Continuation of U.S. patent application Ser. No. 13/166,891, filed Jun. 23, 2011, now U.S. Pat. No. 8,618,589, issued on Dec. 31, 2013, which is a Continuation of U.S. patent application Ser. No. 12/694,336, filed Jan. 27, 2010, now U.S. Pat. No. 8,008,697, issued on Aug. 30, 2011, which is a Divisional of U.S. patent application Ser. No. 11/113,633, filed Apr. 25, 2005, now U.S. Pat. No. 7,675,095, issued on Mar. 9, 2010, the entireties of which are incorporated herein by reference to the extent permitted by law. The present application claims priority to Japanese Patent Application No. JP 2004-129388 filed in the Japanese Patent Office on Apr. 26, 2004, the entirety of which also is incorporated by reference herein to the extent permitted by law.

BACKGROUND OF THE INVENTION

The present invention relates to solid-state imaging devices and driving methods therefor, and in particular, to a complementary metal-oxide semiconductor (CMOS) or metal-oxide semiconductor (MOS) solid-state imaging device and a driving method therefor.

CMOS solid-state imaging devices (hereinafter referred to as "CMOS image sensors"), which can be produced in a process similar to that for CMOS integrated circuits, are known as solid-state imaging devices (see, for example, Japanese Patent Specification No. 3000782). Regarding the CMOS image sensors, by using miniaturization technology related to a CMOS process, an active structure having an amplifying function for each pixel can be easily produced. In addition, the CMOS image sensors have a feature in that peripheral circuits, such as driving circuits for driving a pixel array and a signal processing circuit for processing signals output from the pixel array, are integrated on the same chip (substrate) for the pixel array. Accordingly, in recent years, the CMOS image sensors have attracted attention, and many researches and developments concerning the CMOS image sensors have been performed.

SUMMARY OF THE INVENTION

Analysis by the inventors of the present invention has indicated that, in a solid-state imaging device such as a CMOS image sensor, one of causes of image deterioration is based on the following mechanism. Specifically, when a signal is output from each pixel to a vertical signal line, the potential of the vertical signal line changes. Even if, at this time, the signal is read from the pixel in each row, the potentials of vertical signal lines in the entirety of the pixel array change. Accordingly, the potentials of wells in the pixel array are fluctuated by capacitive coupling in the entirety of the pixel array. When the potential of one well in the pixel array fluctuates while the signal is being read from the pixel, the fluctuation in potential is superimposed on the signal from the pixel. The superimposed fluctuation causes noise and shading (broad unevenness on a captured image on the screen).

The present invention has been made in view of the above circumstance. Accordingly, there is a need for providing a solid-state imaging device and driving method therefor that, by suppressing a fluctuation in well potential of a pixel array while a signal is being read from a pixel, prevent generation of noise and shading caused by the fluctuation in well potential.

According to an embodiment of the present invention, there is provided a solid-state imaging device including a pixel array including pixels arranged two-dimensionally, with a signal line provided in each column of the arranged pixels, each pixel including a photoelectric conversion element, and a fixing unit for fixing the potential of the signal line, which is obtained before the pixel has an operating period, to an intermediate potential between a first power-supply potential and a second power-supply potential.

In the above solid-state imaging device, before the pixel has the operating period, by fixing the potential of the signal line to the intermediate potential, the potential of the signal line changes from the intermediate potential to a reset level if the reset level is output from the pixel to the signal line. Thus, the potential of the signal line has a small change. This minimizes a fluctuation (change) in the potential of the signal line when the reset level is output. Therefore, a fluctuation in well potential of a pixel array due to the fluctuation in the potential of the signal line is suppressed.

According to another embodiment of the present invention, there is provided a driving method for a solid-state imaging device including pixels two-dimensionally arranged in matrix form, with a signal line provided in each column of the arranged pixels, each pixel including a photoelectric conversion element, wherein, before the pixel has an operating period, the potential of the signal line is fixed to an intermediate potential between a first power-supply potential and a second power-supply potential.

According to an embodiment of the present invention, by suppressing a fluctuation in well potential in a pixel array, caused by a fluctuation in potential of a signal line, it is ensured that the fluctuation in well potential is prevented from affecting a reset level and a signal level. Therefore, this prevents generation of noise and shading caused by the fluctuation in well potential.

DESCRIPTION OF THE PREFERRED EMBODIMENTS

Embodiments of the present invention are fully described below with reference to the accompanying drawings.

Figure 1:
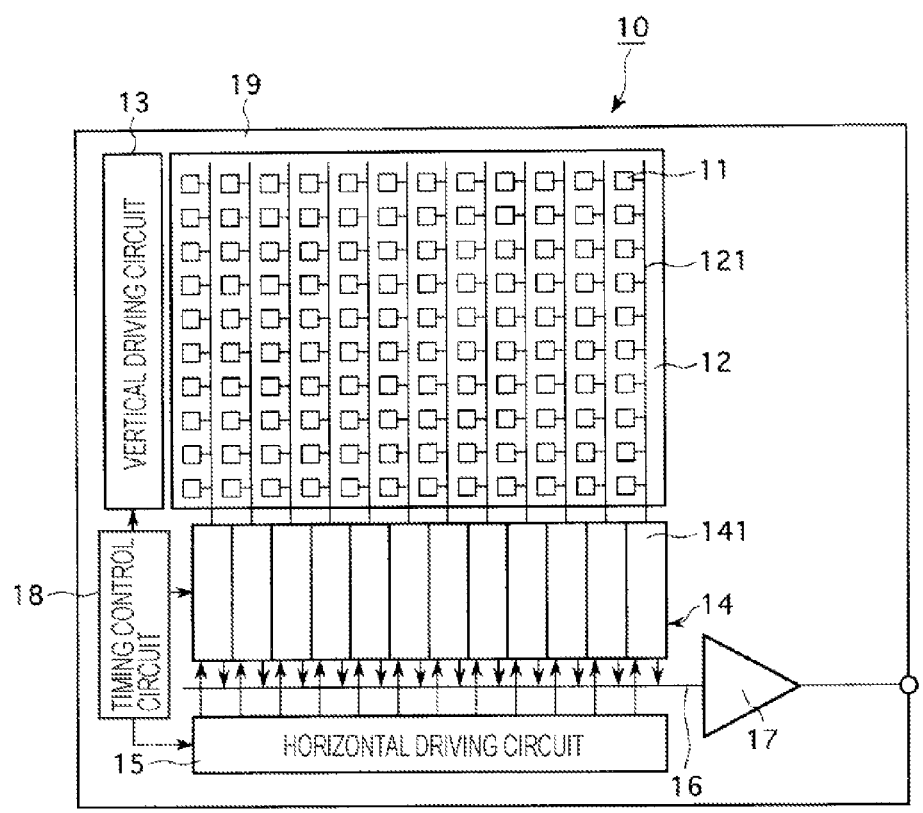
FIG. 1 is a block diagram showing the entirety of a CMOS image sensor according to an embodiment of the present invention.

FIG. 1 is a block diagram showing the entirety of a solid-state imaging device according to an embodiment of the present invention, for example, a CMOS image sensor. The following description is directed to this embodiment of the present invention. However, the present invention is not limited to this embodiment. An embodiment of the present invention may be applied to MOS solid-state imaging devices.

As shown in FIG. 1, a CMOS image sensor 10 according to an embodiment of the present invention includes, not only a pixel array 12 including plural pixels 11 two-dimensionally arranged in matrix form, each pixel including a photoelectric conversion element, but also a vertical driving circuit 13, a column processor 14, a horizontal driving circuit 15, a horizontal signal line 16, an output circuit 17, and a timing control circuit 18.

In this system configuration, based on a vertical synchronizing signal V.sub.sync, a horizontal synchronizing signal H.sub.sync, and a master clock MCK, the timing control circuit 18 generates signals, such as clock signals and control signals which serve as references for the operations of the vertical driving circuit 13, the column processor 14, and the horizontal driving circuit 15. The timing control circuit 18 supplies the generated signals to the vertical driving circuit 13, the column processor 14, the horizontal driving circuit 15, etc. In addition, peripheral driving circuits and signal processing circuit sections for controlling driving of the pixels 11 in the pixel array 12, that is, the vertical driving circuit 13, the column processor 14, the horizontal driving circuit 15, the horizontal signal line 16, the output circuit 17, the timing control circuit 18, etc., are integrated on the same semiconductor substrate (chip) 19 as the pixel array 12 is formed.

In the pixel array 12, the pixels 11 are two-dimensionally arranged in the form of m rows by n columns. In FIG. 1, for brevity of illustration, only the pixel arrangement of 10 rows by 12 columns is shown. In this pixel arrangement of m rows by n columns, row control lines (not shown) are provided in units of rows, and vertical signal lines 121 (121-1 to 121-$n$) are provided in units of columns. The vertical driving circuit 13 includes shift registers. The vertical driving circuit 13 sequentially selects the pixels 11 in the pixel array 12 in units of rows, and supplies necessary pulses to the pixels 11 in the selected row through one row control line.

Signals output from the pixels 11 in the selected row are supplied to the column processor 14 through the vertical signal lines 121. The column processor 14 includes column signal processing circuits 141 corresponding to the columns of the pixels 11 in the pixel array 12. For each column of the pixels 11, after receiving the signals output from the pixels 11 for each row of pixels, the column signal processing circuits 141 perform processing on the signals. The processing includes correlated double sampling (CDS) for eliminating fixed pattern noise unique to the pixels 11, signal amplification, and, if necessary, analog-to-digital conversion.

The horizontal driving circuit 15 includes shift registers. The horizontal driving circuit 15 sequentially selects each of the column signal processing circuits 141 in the column processor 14, and supplies the horizontal signal line 16 with the signals output from the column signal processing circuits 141. The output circuit 17 performs various types of signal processing on the signals sequentially supplied from the column signal processing circuits 141 through the horizontal signal line 16, and outputs the processed signals. Regarding specific signal processing by the output circuit 17, for example, only buffering may be performed, or black level adjustment prior to buffering, correction of variation for each column, signal amplification, and color-related processing may be performed.

First Embodiment

Figure 2:
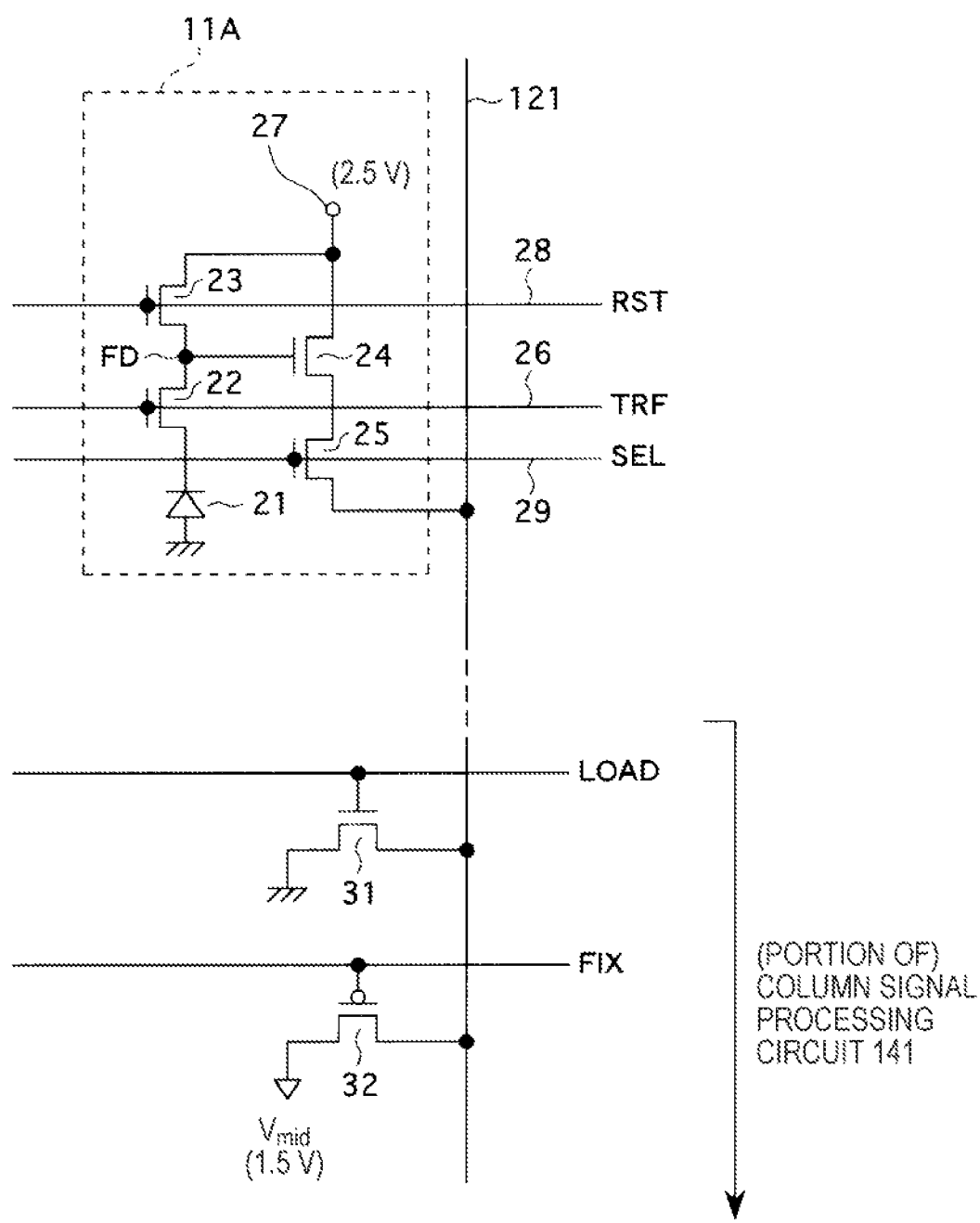
FIG. 2 is a circuit diagram showing a substantial part of a CMOS image sensor according to a first embodiment of the present invention.

FIG. 2 is a circuit diagram showing a substantial part of a CMOS image sensor according to a first embodiment of the present invention. In other words, FIG. 2 shows portions of one pixel and the column signal processing circuit 141. Specifically, FIG. 2 is a circuit diagram only showing one of pixels 11A and the portion of one column signal processing circuit 141 connected to one vertical signal line 121 in the column to which the pixel 11A belongs.

As shown in FIG. 2, the pixel 11A includes a photoelectric conversion element, for example, a photodiode 21, and four transistors, that is, a transfer transistor 22, a reset transistor 23, an amplifying transistor 24, and a selecting transistor 25. FIG. 2 shows a case in which N-channel MOS transistors are used as the transfer transistor 22, the reset transistor 23, the amplifying transistor 24, and the selecting transistor 25. However, P-channel transistors may be used.

The photodiode 21 has an anode connected to have a first power-supply potential, for example, the ground. The photodiode 21 photoelectrically converts incident light to signal charge (photoelectrons) having the quantity of electric charge corresponding to the amount of the incident light, and stores the signal charge. The transfer transistor 22 has a drain connected to a floating diffusion FD, a source connected to the cathode of the photodiode 21, and a gate connected to a transfer wire 26. When the gate of the transfer transistor 22 is supplied with a transfer pulse TRF from the vertical driving circuit 13 through the transfer wire 26, the transfer transistor 22 enters an on-state (conduction state), and transfers the signal charge stored in the photodiode 21 to the floating diffusion FD.

The reset transistor 23 has a drain connected to a power-supply wire 27 having a second power-supply potential, for example, power-supply potential VDD (e.g., 2.5 V), a source connected to the floating diffusion FD, and a gate connected to a reset wire 28. When the gate of the reset transistor 23 is supplied with a reset pulse RST from the vertical driving circuit 13 through the reset wire 28, the reset transistor 23 enters an on-state, and resets the floating diffusion FD by moving the signal charge of the floating diffusion FD to the power-supply wire 27.

The amplifying transistor 24 has a drain connected to the power-supply wire 27, and a gate connected to the floating diffusion FD. The amplifying transistor 24 outputs a signal corresponding to the potential of the floating diffusion FD. The selecting transistor 25 has a drain connected to the source of the amplifying transistor 24, a source connected to the vertical signal line 121, and a gate connected to a selection wire 29. When the gate of the selecting transistor 25 is supplied with a selecting pulse SEL from the vertical driving circuit 13 through the selection wire 29, the selecting transistor 25 enters an on-state to select the pixel 11A, and supplies the vertical signal line 121 with the signal of the pixel 11A output from the amplifying transistor 24.

The transfer wire 26, the reset wire 28, and the selection wire 29 are provided in common for the pixels 11A in the same row. The vertical driving circuit 13 respectively supplies the transfer pulse TRF, the reset pulse RST, and the selecting pulse SEL to the transfer wire 26, the reset wire 28, and the selection wire 29, if necessary, whereby the operation of transferring the signal charge from the photodiode 21 to the floating diffusion FD, the operation of resetting the floating diffusion FD, and the operation of selecting the pixel 11A are controlled.

In an input stage of the column signal processing circuit 141, for example, an N-channel MOS transistor is provided as a load transistor 31. The load transistor 31 has a drain connected to the vertical signal line 121 and a source connected to the ground. The load transistor 31 cooperates with the amplifying transistor 24 in the pixel 11A to serve as a constant current source by using the vertical signal line 121 to form a source follower. When the gate of the load transistor 31 is supplied with a load pulse LOAD, the load transistor 31 enters an on-state and allows the amplifying transistor 24 to output the signal of the pixel 11A to the vertical signal line 121.

The column signal processing circuit 141 further includes, for example, a P-channel MOS transistor 32 (hereinafter referred to as a "fixing transistor 32") as a device that fixes the potential of the vertical signal line 121, which is obtained before the pixel 11A enters an operating period, to predetermined intermediate potential $V_{mid}$ between the potential VDD of the power-supply wire 27 and the ground potential. The fixing transistor 32 has a source connected to the vertical signal line 121 and a drain connected to have intermediate potential $V_{mid}$. When the gate of the fixing transistor 32 is supplied with a fixing pulse FIX in "L" (low) level, the fixing transistor 32 enters an on-state. By supplying intermediate potential $V_{mid}$ to the vertical signal line 121, the fixing transistor 32 fixes the potential of the vertical signal line 121 to intermediate potential $V_{mid}$. For example, a voltage of 1.5 volts is set as intermediate potential $V_{mid}$ for power-supply potential VDD when it is equal to 2.5 volts.

Figure 3:
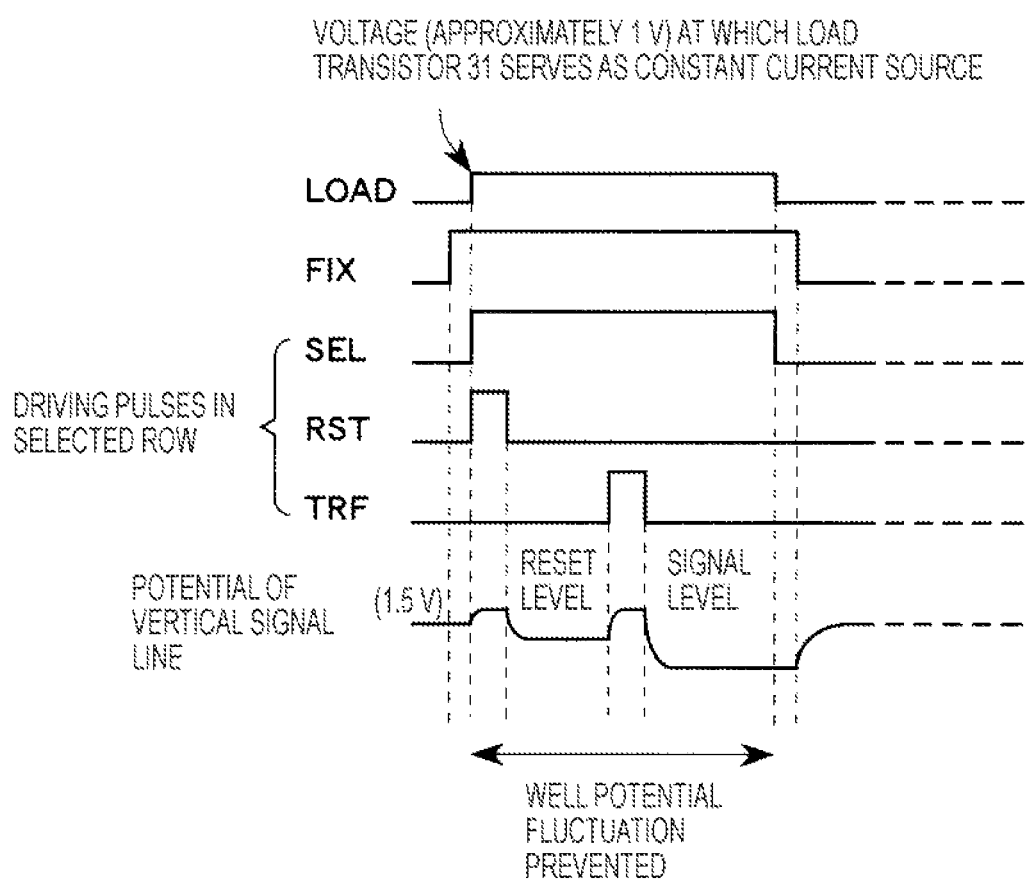
FIG. 3 is a timing chart illustrating an operation of the CMOS image sensor according to the first embodiment of the present invention.

FIG. 3 is a timing chart showing timing with which the CMOS image sensor according to the first embodiment of the present invention is driven. FIG. 3 shows, not only the load pulse LOAD, the fixing pulse FIX, the selecting pulse SEL, the reset pulse RST, and the transfer pulse TRF, but also the schematic waveform of the potential of the vertical signal line 121. For description, the vertical scale for the waveform of the potential of the vertical signal line 121 differs from that for the other pulses. Referring to FIG. 3, when the fixing pulse FIX is in "L" level, it is in active state. When the other pulses, that is, the load pulse LOAD, the selecting pulse SEL, the reset pulse RST, and the transfer pulse TRF are in "H" level, the pulses are in active state. The "H" (high) level of the load pulse LOAD is a voltage (approximately 1 V) at which the load transistor 31 serves as a constant current source.

Before the pixel 11A operates, the fixing pulse FIX is in active state. Thus, the fixing transistor 32 enters the on-state to supply intermediate potential $V_{mid}$ to the vertical signal line 121. Accordingly, before the pixel 11A operates, the potential of the vertical signal line 121 is fixed to intermediate potential $V_{mid}$ (1.5 V in this case) between power-supply potential VDD and the ground potential. Even if the fixing pulse FIX changes from the fixed state into an inactive state, the potential of the vertical signal line 121 is maintained in the vicinity of intermediate potential $V_{mid}$ in a short time.

After that, when the load pulse LOAD and the selecting pulse SEL become active, and the reset pulse RST is simultaneously supplied, the floating diffusion FD in the pixel 11A is reset by the reset transistor 23. After the resetting, the potential of the floating diffusion FD is output as a reset level to the vertical signal line 121 by the amplifying transistor 24.

After the reset level is output, the transfer pulse TRF is supplied, whereby the signal charge (photoelectrons) of the photodiode 21 is transferred to the floating diffusion FD by the transfer transistor 22, and the potential of the floating diffusion FD, which is obtained after the signal charge of the photodiode 21 is transferred, is output as a signal level to the vertical signal line 121 by the amplifying transistor 24. The above reset level and signal level are sequentially sent to the column signal processing circuit 141 through the vertical signal line 121.

For example, by detecting a difference between the reset level and the signal level, the column signal processing circuit 141 performs various types of signal processing such as CDS processing for eliminating fixed pattern noise unique to the pixel 11A, signal maintenance after CDS processing, and amplification.

After that, when the load pulse LOAD and the selecting pulse SEL become inactive, and the fixing pulse FIX becomes active, the fixing transistor 32 enters the on-state to supply intermediate potential $V_{mid}$ to the vertical signal line 121, so that the potential of the vertical signal line 121 is fixed to intermediate potential $V_{mid}$. This state is followed by a period (effective period) in which the signal is output by the column signal processing circuit 141.

In the above case, when the signal is output from the pixel 11A to the vertical signal line 121 and the potential of the vertical signal line 121 changes, capacitive coupling fluctuates the well potentials of the pixel array 12. When the well potentials of the pixel array 12 fluctuate in a period in which the reset level and the signal level are output from the pixel 11A, as described above, the fluctuation in well potential affects the reset level and the signal level, thus causing noise and shading. Accordingly, in the CMOS image sensor according to the first embodiment, operation of the fixing transistor 32 fixes the potential of the vertical signal line 121 to intermediate potential $V_{mid}$ just before the pixel 11A has the operating period so that the well potentials of the pixel array 12 are prevented from being fluctuated.

The most important point at this time is the magnitude (in volts) of the potential of the vertical signal line 121 before the pixels 11 starts to operate. When the potential of the vertical signal line 121 is at, for example, zero volts or the VDD level, and the reset level rapidly changes from these levels, the potential of the vertical signal line 121 considerably changes, thus causing the well potentials of the pixel array 12 to fluctuate. Thus, the fluctuation in well potential affects the reset level and the signal level, thus generating noise and shading.

In a CMOS image sensor of the related art, the potential of the vertical signal line 121, obtained before the pixel 11A starts to operate, is one of zero volts and power-supply potential VDD, or in floating state. The floating state is not preferable because, due to photoelectrons flowing into a diffusion layer of the vertical signal line 121 out of the photodiode 21, the potential of the vertical signal line 121 drops in the vicinity of zero volts when the amount of light is large.

Accordingly, in the CMOS image sensor according to the first embodiment, by fixing the potential of the vertical signal line 121, which is obtained before the pixel 11A enters the operating state, to intermediate potential $V_{mid}$ between power-supply potential VDD and the ground potential (0 V), specifically, to, for example, a potential of 1.5 volts for power-supply potential VDD when it is equal to 2.5 volts, a fluctuation (change) in the potential of the vertical signal line 121, occurring when the vertical signal line 121 changes to the reset level, is minimized. This can minimize an adverse effect, to the reset level and the signal level, of the fluctuation in well potential of the pixel array 12 due to the fluctuation in potential of the vertical signal line 121. Thus, the generation of noise and shading caused by the fluctuation in well potential can be minimized.

In order to minimize the fluctuation in potential of the vertical signal line 121, it is preferable to set intermediate potential V.sub.mid in the vicinity of the reset level. Coupling between the reset transistor 23 and the floating diffusion FD changes the potential of the vertical signal line 121 by, for example, approximately 0.3 volts. In the case shown in FIG. 3, since the potential of the vertical signal line 121, which is obtained when the reset pulse RST is in active state, is 1.6 volts, and the reset level thereafter is 1.3 volts, intermediate potential V.sub.mid is set to the intermediate value between 1.6 volts and 1.3 volts, that is, 1.5 volts.

As described above, it is preferable that intermediate potential V.sub.mid be set between 1.6 volts and 1.3 volts. However, obviously, if intermediate potential V.sub.mid is not therebetween but a value between power-supply potential VDD and the ground potential (0 V), an advantage is obtained in that the well potentials of the pixel array 12 are prevented from fluctuating by suppressing the fluctuation in potential of the pixel array 12 in the case of changing to the reset level.

The first embodiment describes a case in which the potential of the vertical signal line 121 is fixed to the fluctuation in well potential of the pixel array 12 just after the operating period of the pixel 11A ends. However, the fixation does not necessarily need to be performed just after the operating period of the pixel 11A ends. Slightly before the pixel 11A has the operating period, specifically, up to approximately the time constant of the fluctuation in well potential of the pixel array 12, by fixing the potential of the vertical signal line 121 to intermediate potential V.sub.mid, the desired function can be obtained.

Second Embodiment

Figure 4:
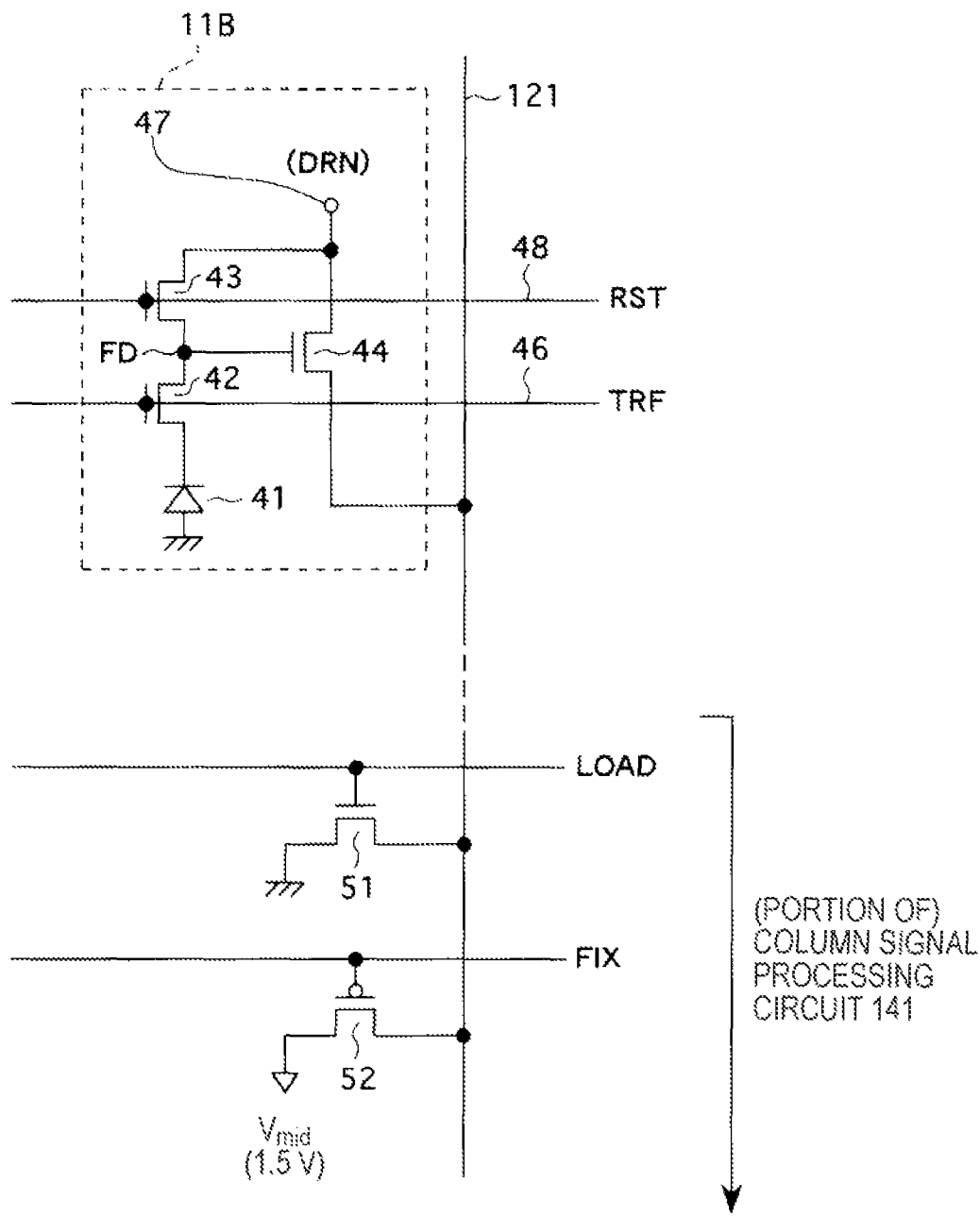
FIG. 4 is a circuit diagram showing a substantial part of a CMOS image sensor according to a second embodiment of the present invention.

FIG. 4 is a circuit diagram showing a substantial part of a CMOS image sensor according to a second embodiment of the present invention. In other words, FIG. 4 shows portions of a pixel and a column signal processing circuit. Specifically, FIG. 4 is a circuit diagram only showing one of pixels 11B and a portion of one column signal processing circuit 141 connected to one vertical signal line 121 in the column to which the pixel 11B belongs.

As shown in FIG. 4, the pixel 11B includes a photoelectric conversion element, for example, a photodiode 41, and three transistors, that is, a transfer transistor 42, a reset transistor 43, and an amplifying transistor 44. FIG. 4 shows a case in which N-channel MOS transistors are used as the transfer transistor 42, the reset transistor 43, and the amplifying transistor 44. Instead, P-channel MOS transistors may be used.

The photodiode 41 has an anode connected to the ground. The photodiode 41 converts incident light into signal charge (photoelectrons) having the amount of charge corresponding to the amount of the incident light, and stores the signal charge. The transfer transistor 42 has a drain connected to a floating diffusion FD, a source connected to the cathode of the photodiode 41, and a gate connected to a transfer wire 46. When the gate of the transfer transistor 42 is supplied with a transfer pulse TRF through the transfer wire 46, the transfer transistor 42 enters an on-state to transfer the signal charge stored in the photodiode 41 to the floating diffusion FD.

The reset transistor 43 has a drain connected to a drain driving wire 47, a source connected to the floating diffusion FD, and a gate connected to a reset wire 48. When the gate of the reset transistor 43 is supplied with a reset pulse RST, the reset transistor 43 enters an on-state and resets the floating diffusion FD by moving the signal charge at the floating diffusion FD to the drain driving wire 47. The drain driving wire 47 is supplied with a drain pulse DRN. The amplifying transistor 44 has a drain connected to the drain driving wire 47, and a gate connected to the floating diffusion FD. The amplifying transistor 44 outputs, to a vertical signal line 121, a signal corresponding to the potential of the floating diffusion FD.

The transfer wire 46 and the reset wire 48 are provided in common for the pixels 11B in the same row. As described above, the vertical driving circuit 13 respectively supplies the transfer pulse TRF and the reset pulse RST to the transfer wire 46 and the reset wire 48, if necessary, whereby the operation of transferring the signal charge from the photodiode 41 to the floating diffusion FD and the operation of resetting the floating diffusion FD are performed.

The pixel 11B in the second embodiment which has three transistors has two differences from the pixel 11A in the first embodiment which has four transistors. As is obvious from the above description, one difference is that the pixel 11B does not include the selecting transistor 25. The other difference is that the pixel 11B uses the drain driving wire 47 instead of the power-supply wire 27. The drain driving wire 47 is provided in common for the entirety of the pixel array 12.

Based on the above differences, the pixel 11A in the first embodiment uses the selecting transistor 25 to perform pixel selection, while the pixel 11B in the second embodiment performs pixel selection by controlling the potential of the floating diffusion FD. Specifically, by normally setting the potential of the floating diffusion FD to the "L" level, and, when selecting the pixel 11B, setting the potential of the selected pixel to the "H" level, a signal of the selected pixel is output to the vertical signal line 121 by the amplifying transistor 44.

In an input stage of the column signal processing circuit 141, for example, an N-channel MOS transistor is provided as a load transistor 51. The load transistor 51 has a drain connected to the vertical signal line 121 and a source connected to the ground. The load transistor 51 cooperates with the amplifying transistor 44 in the pixel 11B to serve as a constant current source by using the vertical signal line 121 to form a source follower. When the gate of the load transistor 51 is supplied with a load pulse LOAD, the load transistor 51 enters an on-state and allows the amplifying transistor 44 to output the signal of the pixel 11B to the vertical signal line 121.

The column signal processing circuit 141 further includes, for example, a P-channel MOS transistor 52 (hereinafter referred to as a "fixing transistor 52") as a device that fixes the potential of the vertical signal line 121, which is obtained before the pixel 11B has an operating period, to predetermined intermediate potential V.sub.mid between the potential VDD and the ground potential. The fixing transistor 52 has a source connected to the vertical signal line 121 and a drain connected to have predetermined intermediate potential V.sub.mid. When the gate of the fixing transistor 52 is supplied with a fixing pulse FIX in "L" level, the fixing transistor 52 enters an on-state. By supplying intermediate potential V.sub.mid to the vertical signal line 121, the fixing transistor 52 fixes the potential of the vertical signal line 121 to intermediate potential V.sub.mid. For example, a voltage of 1.5 volts is set as intermediate potential V.sub.mid for power-supply potential VDD when it is equal to 2.5 volts.

Figure 5:
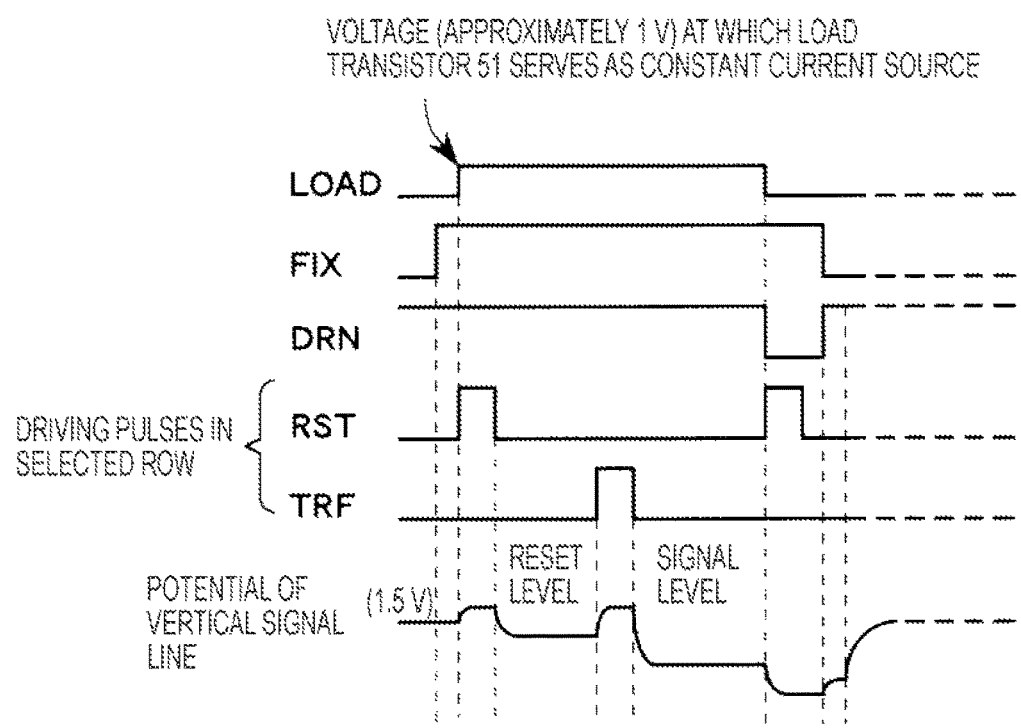
FIG. 5 is a timing chart illustrating an operation of the CMOS image sensor according to the second embodiment of the present invention.

FIG. 5 is a timing chart showing timing with which the CMOS image sensor according to the second embodiment is driven. FIG. 5 shows, not only the load pulse LOAD, the fixing pulse FIX, the selecting pulse SEL, the reset pulse RST, and the transfer pulse TRF, but also the schematic waveform of the potential of the vertical signal line 121. For description, the vertical scale for the waveform of the potential of the vertical signal line 121 differs from that for the other pulses. Referring to FIG. 5, when the fixing pulse FIX is in "L" level, it is in active state. When the other pulses, that is, the load pulse LOAD, the drain pulse DRN, the reset pulse RST, and the transfer pulse TRF are in "H" level, the pulses are in active state. The "H" level of the load pulse LOAD is a voltage (approximately 1 V) at which the load transistor 31 serves as a constant current source.

Before the pixel 11B has the operating period, the drain pulse DRN and the fixing pulse FIX are in the active state. Thus, the fixing transistor 52 enters the on-state to supply intermediate potential V.sub.mid to the vertical signal line 121. Accordingly, before the pixel 11B has the operating period, the potential of the vertical signal line 121 is fixed to intermediate potential V.sub.mid (1.5 V in this case) between power-supply potential VDD and the ground potential. Even if the fixing pulse FIX changes from the fixed state into an inactive state, the potential of the vertical signal line 121 is maintained in the vicinity of intermediate potential V.sub.mid in a short time.

After that, when the load pulse LOAD become active, and the reset pulse RST is simultaneously supplied, the floating diffusion FD in the pixel 11B is reset by the reset transistor 43. After the resetting, the potential of the floating diffusion FD is output as a reset level to the vertical signal line 121 by the amplifying transistor 44.

After the reset level is output, and the transfer pulse TRF is supplied, whereby the signal charge (photoelectrons) of the photodiode 41 is transferred to the floating diffusion FD by the transfer transistor 42, and the potential of the floating diffusion FD, which is obtained after the signal charge of the photodiode 41 is transferred, is output as a signal level to the vertical signal line 121 by the amplifying transistor 44. The above reset level and signal level are sequentially sent to the column signal processing circuit 141 through the vertical signal line 121. The column signal processing circuit 141 performs signal processing on the sent signals similarly to that in the first embodiment.

After that, when the load pulse LOAD and the drain pulse DRN become inactive, and the reset pulse RST simultaneously becomes active, the reset transistor 43 enters the on-state, so that the potential of the floating diffusion FD has the "L" level. After that, the drain pulse DRN becomes active. Subsequently, when the fixing pulse FIX becomes active, the fixing transistor 52 enters the on-state to supply intermediate potential V.sub.mid to the vertical signal line 121. Thus, the potential of the vertical signal line 121 is fixed to intermediate potential V.sub.mid again. After that, this state is followed by a period (effective period) in which the signal is output by the column signal processing circuit 141.

Operation and advantages obtained by using the fixing transistor 52 to fix the potential of the vertical signal line 121, which is obtained just before the operating period of the pixel 11B, to intermediate potential V.sub.mid, and setting intermediate potential V.sub.mid in the vicinity of the reset level, that is, the prevention of the well potentials of the pixel array 12 from fluctuating when the signal is output from the pixel 11B to the vertical signal line 121, is similar to that in the first embodiment.

However, in the pixel 11B, which has three transistors, as described above, the potential of the drain driving wire 47, which is provided in common for the entirety of the pixel array 12, is not constantly fixed, but the drain pulse DRN is supplied to the drain driving wire 47 for the purpose of controlling the floating diffusion FD. Thus, the potential of the drain driving wire 47 changes. Accordingly, also when the potential of the drain driving wire 47 changes, the well potentials of the pixel array 12 are affected by coupling to fluctuate.

Therefore, if timing with which the potential of the drain driving wire 47 is returned from the inactive level ("L" level) to the active level ("H" level) is before the pixel 11B has the operating period, the change in potential of the drain driving wire 47 remains until the operating period of the pixel 11B, thus resulting in generation of noise and shading due to the fluctuation in well potential of the pixel array 12. When considering this point, in the CMOS image sensor according to the second embodiment, the operation of returning the drain pulse DRN from the inactive level to the active level is performed after the operating period of the pixel 11B ends, specifically, after completion of the reset operation after reading the reset level and the signal level. The term "after" in this case means avoiding the time "before" the pixel operating period, and represents such a time that, after the pixel operation in a certain row finishes, does not pass to reach the time just before the operation of a pixel in the next row. Preferably, the term "after" represents the time before the effective period begins.

As described above, in the CMOS image sensor according to the second embodiment, by fixing the potential of the vertical signal line 121, which is obtained before the pixel 11B has the operating period, to intermediate potential V.sub.mid between power-supply potential VDD and the ground potential (0 V), and employing a configuration for performing the operation of returning the potential of the drain driving wire 47 from the inactive level to the active level after the operating period of the pixel 11B ends, the fluctuation in well potential of the pixel array 12 can be prevented from affecting the reset level and the signal level as much as possible. Therefore, the generation of noise and shading due to the fluctuation in well potential can be prevented as much as possible.

In the reset transistor 43, low threshold value V.sub.th is normally set in order to maximize the set potential of the floating diffusion FD when it is reset. Accordingly, if the setting of the potential of the drain driving wire 47 to the "H" level is performed after reading the signal from the pixel 11B, after that, a leak current is generated in the reset transistor 43 in which the low threshold value V.sub.th is set, and the leak current increases the potential of the floating diffusion FD by, for example, 200 millivolts. In this case, the above increase serves as an obstacle to reduction of power-supply potential VDD.

Accordingly, it is preferable that the level ("L" level) of the reset pulse RST, which is supplied to the gate of the reset transistor 43 when the reset pulse RST is inactive, be set to a negative voltage. This ensures that the reset transistor 43 is set to the off-state, thus preventing the current leak from the reset transistor 43, so that reduction in power-supply potential VDD can be performed. It is obvious that, when the photodiode is of a positive hole storing type and is a P-channel MOS transistor, the level ("H" level) of the reset pulse RST when it is inactive needs to be set to be equal to or greater than power-supply potential VDD.

In addition, it is preferable that, in order to secure an operating range, the "H" level of the reset pulse RST be set to be equal to or greater than power-supply potential VDD by setting the threshold value $V_{th}$ of the reset transistor 43 to a value in which the leak can be ignored, specifically, a value lower than that for transistors used in peripheral circuits (such as the vertical driving circuit 13 and the column processor 14) for the pixel array 12. When plural power supplies are used, it is preferable that the "H" level of the reset pulse RST be set to be equal to or greater than a power-supply voltage which is used as the "H" level of the drain driving wire 47.

Modifications

The above-described first and second embodiments describe cases in which, before the pixel 11A or 11B has the operating period, intermediate potential $V_{mid}$ supplied to the vertical signal line 121 is set beforehand as a fixed value (preferably, in the vicinity of the reset level). However, also a configuration in which the optimal value is set as intermediate potential $V_{mid}$ whenever the pixel 11A or 11B operates can be employed.

Figure 6:
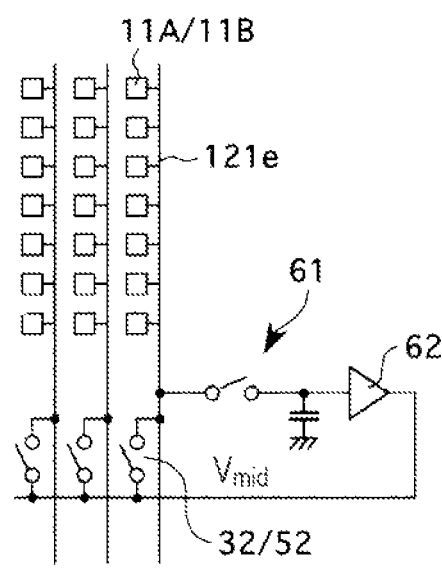
FIG. 6 is a circuit diagram showing modifications of the first and second embodiments of the present invention.

Specifically, as shown in FIG. 6, a sample-and-hold circuit 61 is connected to one vertical signal line 121, preferably, a vertical signal line 121e at an outermost end. In the sample-and-hold circuit 61, the reset level supplied from the pixel 11A or 11B through the vertical signal line 121e is sampled and held, and the held value (reset level) is supplied as intermediate potential $V_{mid}$ to the fixing transistor 32 or 52 through a buffer 62. The sampled and held value may be, for example, the voltage value of the vertical signal line 121e, which is obtained while the reset pulse RST is being active, if the value is close to the reset level.

By employing this configuration, the optimal value for intermediate potential $V_{mid}$ whenever the pixel 11A or 11B operates, that is, the reset level, can be set. Thus, fluctuation in potential of the vertical signal line 121, which occurs in the case of changing to the reset level, can be minimized. Therefore, it is ensured that fluctuation in well potential of the pixel array 12 due to fluctuation in potential of the vertical signal line 121, and the generation of noise and shading due to the fluctuation in the well potential are prevented. In the above modification, the sample-and-hold circuit 61 is provided for the vertical signal line 121e at the outermost end. However, in a configuration, the sample-and-hold circuit 61 may be provided for each of the vertical signal lines 121. According to this configuration, the optimal value can be set as intermediate potential $V_{mid}$ for each of the vertical signal lines 121.

Figure 7:
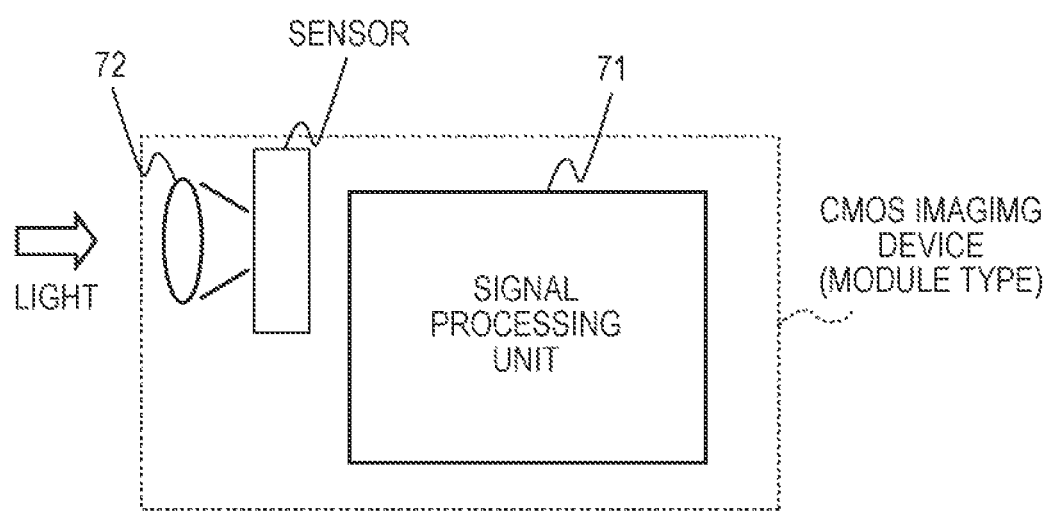
FIG. 7 is a block diagram showing a CMOS imaging device of a module type according to an embodiment of the present invention.

A CMOS image sensor according to an embodiment of the present invention may have other structures, in addition to the structure shown in FIG. 1. FIG. 7 is a block diagram of an imaging device of a module type according to the embodiment of the present invention, which includes a signal processing unit 71 for processing signals from pixels and an optical system 72.

It should be understood by those skilled in the art that various modifications, combinations, sub-combinations and alternations may occur depending on design requirements and other factors insofar as they are within the scope of the appended claims or the equivalents thereof.

The invention claimed is:

1. An imaging device comprising:
    a plurality of pixels, each of the plurality of pixels including
        a photoelectric conversion element,
        a floating diffusion,
        a transfer transistor configured to supply a charge from the photoelectric conversion element to the floating diffusion,
        a reset transistor configured to supply a first voltage to the floating diffusion, and
        an amplifying transistor configured to output an analog signal corresponding to a potential of the floating diffusion to a vertical signal line; and
    a plurality of column processors, each of the plurality of column processors configured to receive the analog signal through the vertical signal line and convert the analog signal into a digital signal,
    wherein each of plurality of column processors includes a fixing transistor configured to apply a predetermined voltage to the vertical signal line.

2. The imaging device according to claim 1, wherein a potential of the predetermined voltage is between a potential of the first voltage and a potential of a ground voltage.

3. The imaging device according to claim 2, wherein the predetermined voltage is 1.5V.

4. The imaging device according to claim 1, wherein the predetermined voltage is applied between at the end of an operation of a first pixel row and at the beginning of an operation of a second pixel row.

5. The imaging device according to claim 1, wherein the predetermined voltage is not applied during an operation of the first pixel row or the second pixel row.

6. The imaging device according to claim 1, wherein
    the pixel includes a selecting transistor connected between the amplifying transistor and the vertical signal line, and
    the predetermined voltage is applied only while the selecting transistor is in an off-state.

7. The imaging device according to claim 1, wherein
    the amplifying transistor is configured to supply the analog signal to the vertical signal line when a potential of the floating diffusion is an "H" level, and
    the predetermined voltage is applied only while the floating diffusion is in an "L" level.

8. The imaging device according to claim 7, wherein a potential of the "H" level is higher than a potential of the "L" level.

9. The imaging device according to claim 7, wherein a potential of the "L" level is a negative voltage.

10. The imaging device according to claim 1, wherein the fixing transistor is a P-channel MOS transistor.

11. An imaging device comprising:
    an optical system;
    a plurality of pixels, each of the plurality of pixels including
        a photoelectric conversion element,
        a floating diffusion,
        a transfer transistor configured to supply a charge from the photoelectric conversion element to the floating diffusion,
        a reset transistor configured to supply a first voltage to the floating diffusion, and
        an amplifying transistor configured to output an analog signal corresponding to a potential of the floating diffusion to a vertical signal line;
    a plurality of column processors, each of the plurality of column processors configured to receive the analog signal through the vertical signal line and convert the analog signal into a digital signal; and a signal processing unit, wherein each of plurality of column processors includes a fixing transistor configured to apply a predetermined voltage to the vertical signal line.

12. The imaging device according to claim 11, wherein a potential of the predetermined voltage is between a potential of the first voltage and a potential of a ground voltage.

13. The imaging device according to claim 12, wherein the predetermined voltage is 1.5V.

14. The imaging device according to claim 11, wherein the predetermined voltage is applied between at the end of an operation of a first pixel row and at the beginning of an operation of a second pixel row.

15. The imaging device according to claim 11, wherein the predetermined voltage is not applied during an operation of the first pixel row or the second pixel row.

16. The imaging device according to claim 11, wherein the pixel includes a selecting transistor connected between the amplifying transistor and the vertical signal line, and the predetermined voltage is applied only while the selecting transistor is in an off-state.

17. The imaging device according to claim 11, wherein the amplifying transistor is configured to supply the analog signal to the vertical signal line when a potential of the floating diffusion is an "H" level, and the predetermined voltage is applied only while the floating diffusion is in an "L" level.

18. The imaging device according to claim 17, wherein a potential of the "H" level is higher than a potential of the "L" level.

19. The imaging device according to claim 17, wherein a potential of the "L" level is a negative voltage.

20. The imaging device according to claim 11, wherein the fixing transistor is a P-channel MOS transistor.

* * * * *